United States Patent
Sung

(10) Patent No.: US 8,853,681 B2
(45) Date of Patent: Oct. 7, 2014

(54) ORGANIC LIGHT EMITTING DIODE ILLUMINATING DEVICE

(71) Applicant: Ultimate Image Corporation, Miaoli (TW)

(72) Inventor: Chih-Feng Sung, Miaoli (TW)

(73) Assignee: Ultimate Image Corporation, Miaoli (TW)

(*) Notice: Subject to any disclaimer, the term of this patent is extended or adjusted under 35 U.S.C. 154(b) by 0 days.

(21) Appl. No.: 14/011,999

(22) Filed: Aug. 28, 2013

(65) Prior Publication Data
US 2014/0070192 A1    Mar. 13, 2014

(30) Foreign Application Priority Data
Sep. 10, 2012  (TW) ............................. 101133004 A

(51) Int. Cl.
*H01L 29/00* (2006.01)
*H01L 35/24* (2006.01)
*H01L 51/00* (2006.01)
*H01L 51/52* (2006.01)

(52) U.S. Cl.
CPC ......... *H01L 51/5203* (2013.01); *H01L 51/5256* (2013.01); *H01L 51/5253* (2013.01)
USPC .................................. 257/40; 257/79; 257/100

(58) Field of Classification Search
CPC ............ H01L 51/5237; H01L 51/5253; H01L 51/5256
USPC ............................................. 257/40, 79, 100
See application file for complete search history.

*Primary Examiner* — Colleen A Matthews
*Assistant Examiner* — Quovaunda V Jefferson
(74) *Attorney, Agent, or Firm* — Trop Pruner & Hu, P.C.

(57) ABSTRACT

An OLED illuminating device includes an OLED unit and an insulating unit. The OLED unit includes: a substrate having a top surface that includes a first zone provided with a terminal area; a light emitting element having a first electrode layer that includes a first terminal portion disposed on the terminal area, a second electrode layer that includes a second terminal portion disposed on the terminal area, and an organic light emitting multilayer structure; and a packaging cover partially covering the light emitting element in such a manner that the first and second terminal portions are exposed therefrom. The insulating unit covers the first and second terminal portions and is bonded adhesively to the terminal area.

5 Claims, 9 Drawing Sheets

ORGANIC LIGHT EMITTING DIODE ILLUMINATING DEVICE

CROSS-REFERENCE TO RELATED APPLICATION

This application claims priority of Taiwanese Application No. 101133004, filed on Sep. 10, 2012.

BACKGROUND OF THE INVENTION

1. Field of the Invention

The invention relates to an illuminating device, more particularly to an organic light emitting diode (abbreviated as OLED hereinafter) illuminating device.

2. Description of the Related Art

Referring to FIGS. 1 and 2, a conventional OLED illuminating device 1 is electrically coupled to an external power supply circuit (not shown) by an electrode clamping unit 11 and includes a transparent substrate 12, a light emitting element 13, and a packaging cover 14.

The transparent substrate 12 has a top surface 121. The light emitting element 13 is disposed on the top surface 121 and includes an anode layer 131 (such as a transparent ITO layer), a cathode layer 132, and an organic light emitting multilayer structure 133 that is disposed between the anode layer 131 and the cathode layer 132 and that electrically insulates the anode layer 131 from the cathode layer 132. Each of the anode and cathode layers 131, 132 has a contact portion 134, 135 that extends toward a periphery of the top surface 121 of the substrate 12 and that is electrically coupled to the external power supply circuit by being respectively in contact with anode and cathode contacts 111, 112 of the electrode clamping unit 11. The packaging cover 14 covers the organic light emitting multilayer structure 133 and partially covers the anode and cathode layers 131, 132 in such a manner that the contact portions 134, 135 of the anode and cathode layers 131, 132 are exposed from the packaging cover 14.

Considering the alignment of the anode and cathode contacts 111, 112 of the electrode clamping unit 11, areas of the contact portions 134, 135 of the anode and cathode layers 131, 132 are usually designed to be significantly larger than the contact areas of the anode and cathode contacts 111, 112. Therefore, majority of the areas of the contacts portions 134, 135 are still exposed from the packaging cover 14 and from the anode and cathode contacts 111, 112. Once an electrically conductive object 15 is simultaneously in contact with the contact portions 134, 135, short circuit may occur and cause damage to the conventional OLED illuminating device 1. Reference may be made to U.S. Pat. No. 8,154,200 B2 and TW patent publication NO. 201216760 for further details regarding the structure of the conventional OLED illuminating device 1.

SUMMARY OF THE INVENTION

Therefore, the object of the present invention is to provide an OLED illuminating device that may alleviate the aforementioned drawback of the prior art.

Accordingly, an OLED illuminating device of the present invention is adapted to be coupled to a power supply and comprises:

an OLED unit including a substrate having a top surface that includes a first zone and a second zone surrounded by the first zone, the first zone having a terminal area, a light emitting element disposed on the top surface and having a first electrode layer that includes a first terminal portion which is disposed on the terminal area, a second electrode layer that is disposed on the first electrode layer and that includes a second terminal portion which is disposed on the terminal area, and an organic light emitting multilayer structure that is disposed on the second zone of the top surface and between the first and second electrode layers, the first and second terminal portions being adapted to be coupled to the power supply, and a packaging cover covering the light emitting element disposed on the second zone and uncovering the first zone so that the first terminal portion of the first electrode layer and the second terminal portion of the second electrode layer are exposed from the packaging cover; and an insulating unit that covers the first and second terminal portions of the first and second electrode layers and that is bonded adhesively at least to the terminal area of the top surface of the substrate.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
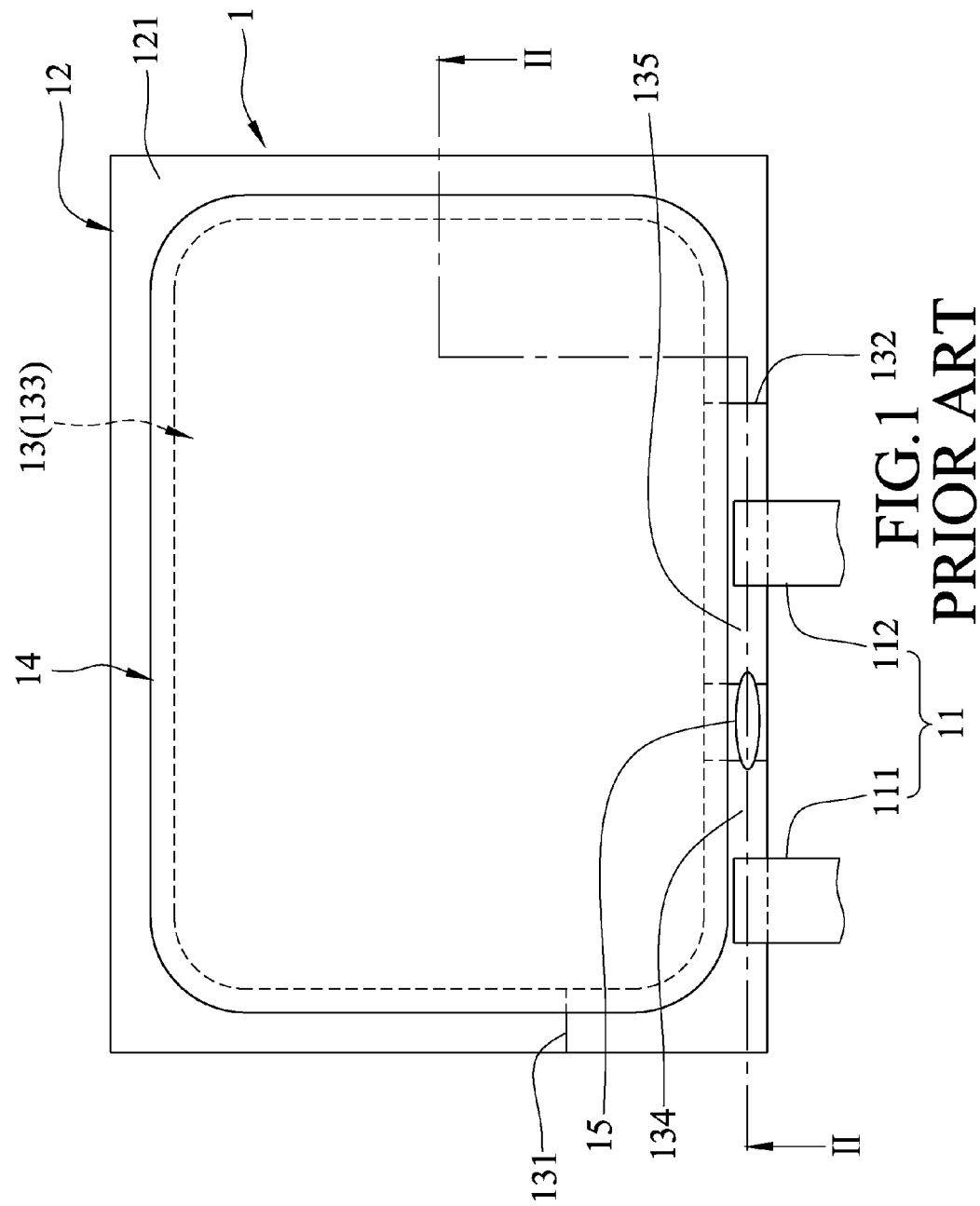
FIG. 1 is a schematic top view of a conventional OLED illuminating device illustrating an electrically conductive object bridging a contact portion of an anode layer to a contact portion of a cathode layer.
Figure 2:
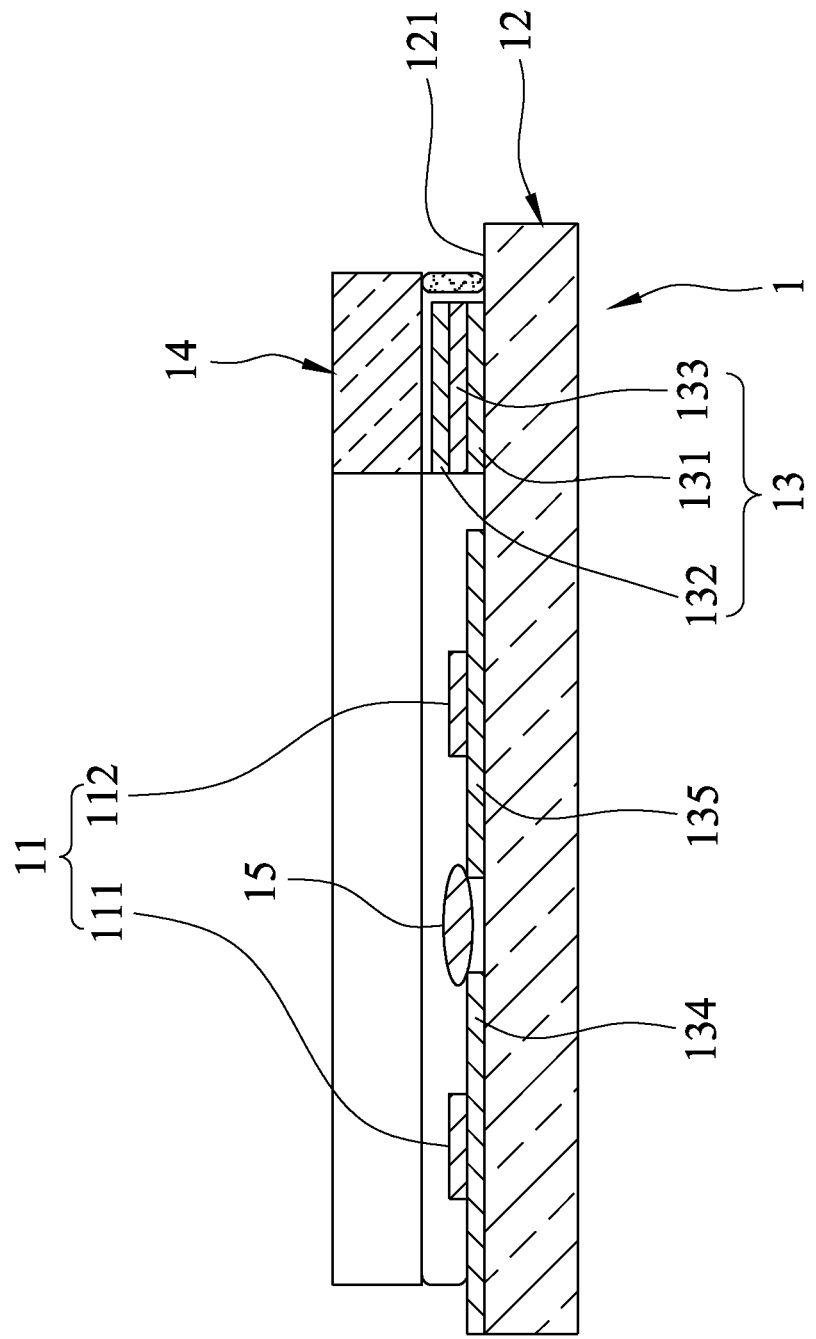
FIG. 2 is a sectional view of the conventional OLED illuminating device taken along line II-II of FIG. 1.

Before the present invention is described in greater detail, it should be noted that like elements are denoted by the same reference numerals throughout the disclosure.

Figure 3:
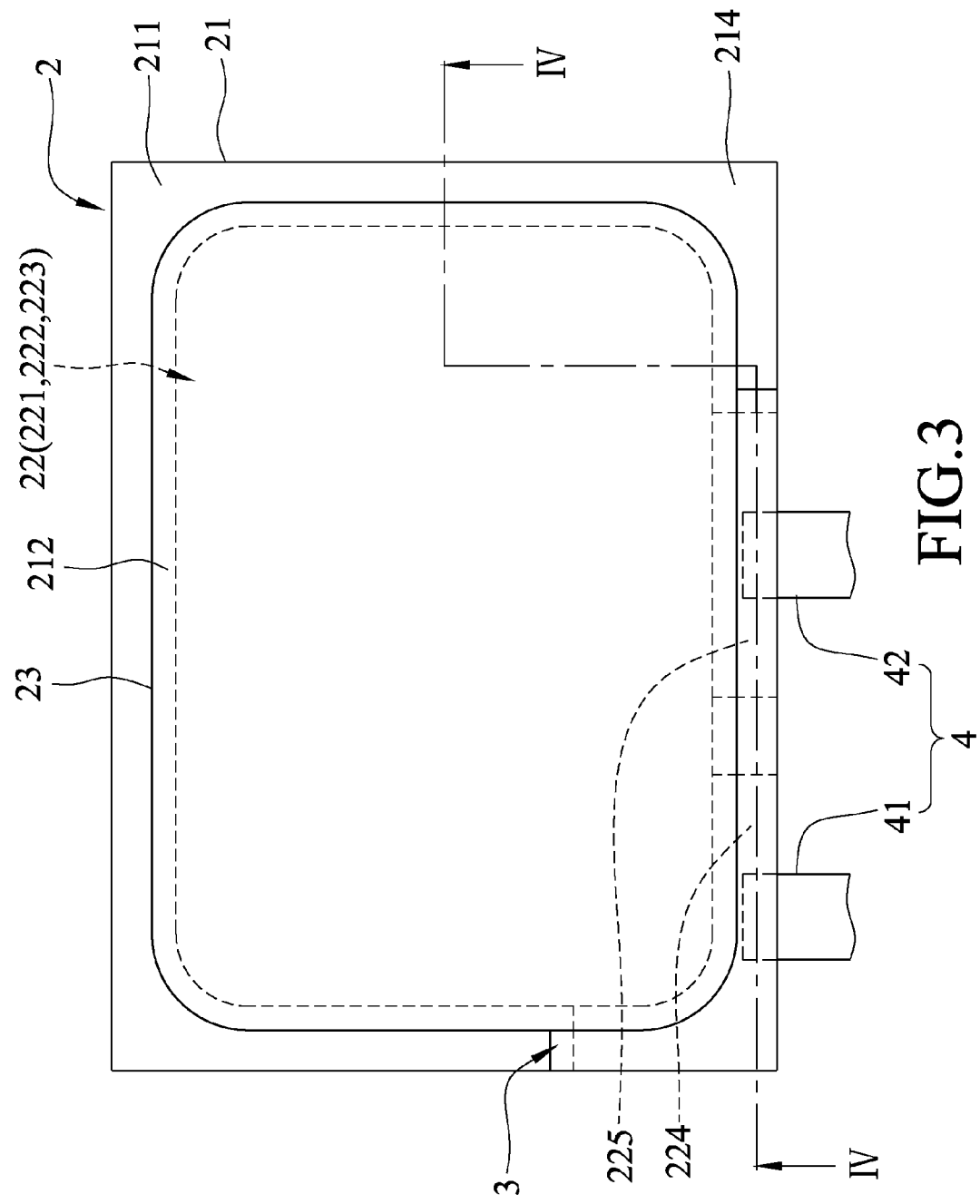
FIG. 3 is a schematic top view of a first preferred embodiment of an OLED illuminating device according to the present invention.
Figure 4:
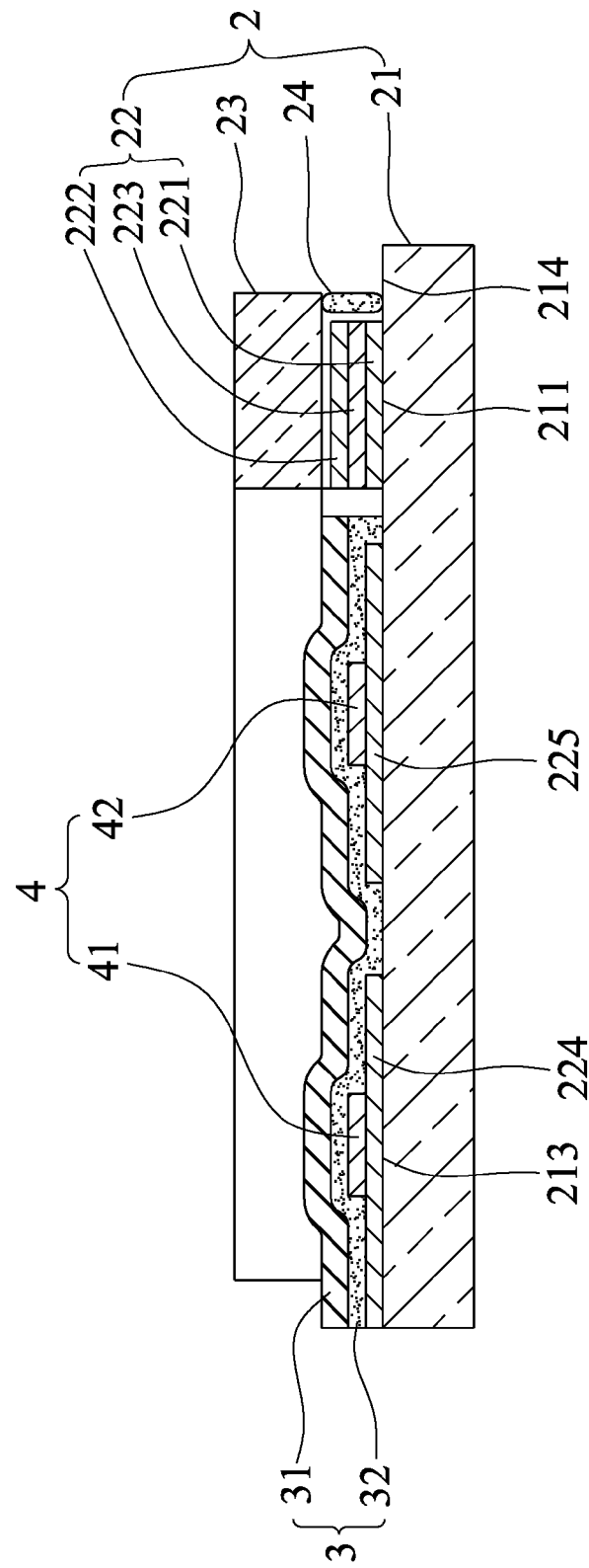
FIG. 4 is a sectional view of the first preferred embodiment taken along line IV-IV of FIG. 3.

Referring to FIGS. 3 and 4, a first preferred embodiment of an OLED illuminating device according to the present invention is adapted to be electrically coupled to a power supply (not shown) and includes an OLED unit 2 and an insulating unit 3.

The OLED unit 2 includes a substrate 21, a light emitting element 22, and a packaging cover 23.

In this embodiment, the substrate 21 is a transparent substrate and has a top surface 211 that includes a first zone 214 and a second zone 212 surrounded by the first zone 214. The first zone 214 has a terminal area 213.

The light emitting element 22 is disposed on the top surface 211 of the substrate 21 and includes a first electrode layer 221, an organic light emitting multilayer structure 223, and a second electrode layer 222. The first electrode layer 221 has a first terminal portion 224 which is disposed on the terminal area 213. The organic light emitting multilayer structure 223 is disposed on the first electrode layer 221 and on the second zone 212 of the top surface 211. The second electrode layer 222 is disposed on the organic light emitting multilayer structure 223 and includes a second terminal portion 225 which is disposed on the terminal area 213. The second electrode layer 222 is electrically insulated from the first electrode layer 221 by the organic light emitting multilayer structure 223. The first terminal portion 224 of the first electrode layer 221 and the second terminal portion 225 of the second electrode layer 222 are respectively coupled to an anode contact 41 and a cathode contact 42 of a flexible printed circuit board 4 (FPCB), so as to be electrically coupled to the power supply. The organic light emitting multilayer structure 223 includes a hole injection layer, a hole transfer layer, an emissive layer, an electron transfer layer, and an electron injection layer that are sequentially stacked on the first electrode layer 221. In this embodiment, the first electrode layer 221 works as an anode, and the second electrode layer 222 works as a cathode.

The packaging cover 23 is fixedly attached to the top surface 211 of the substrate 21 via a packaging glue 24 and covers the light emitting element 22 disposed on the second zone 212 of the top surface 211 and uncovers the first zone 214 so that the first terminal portion 224 of the first electrode layer 221 and the second terminal portion 225 of the second electrode layer 222 are exposed therefrom. In this embodiment, the packaging cover 23 is made of a glass material or a stiff plastic material. In this embodiment, the packaging glue 24 is an ultraviolet cured adhesive or a glass glue.

The insulating unit 3 is bonded adhesively at least to the terminal area 213 of the top surface 211 of the substrate 21 and covers the first terminal portion 224 of the first electrode layer 221 and the second terminal portion 225 of the second electrode layer 222. The insulating unit 3 includes an insulating layer 31 and an adhesive layer 32 that is formed on a bottom surface of the insulating layer 31 and that connects the insulating layer 31 to the light emitting element 2. Besides, a top surface of the insulating layer 31 is not adhesive, such that the insulating layer 31 is not a medium for the light emitting element 2 to connect to other elements in the OLED illuminating device. In this embodiment, the insulating unit 3 is bonded adhesively to the top surface 211 of the substrate 21 after the first terminal portion 224 of the first electrode layer 221 and the second terminal portion 225 of the second electrode layer 222 are respectively coupled to the anode and cathode contacts 41, 42 of the FPCB 4, so that the anode and cathode contacts 41, 42 of the FPCB 4 are also covered by the insulating unit 3.

By utilizing the insulating unit 3, the first terminal portion 224 of the first electrode layer 221 and the second terminal portion 225 of the second electrode layer 222 are covered, thereby preventing the first and second terminal portions 224, 225 from being simultaneously in contact with an electrically conductive object and causing short circuit of the light emitting element 2.

Figure 5:
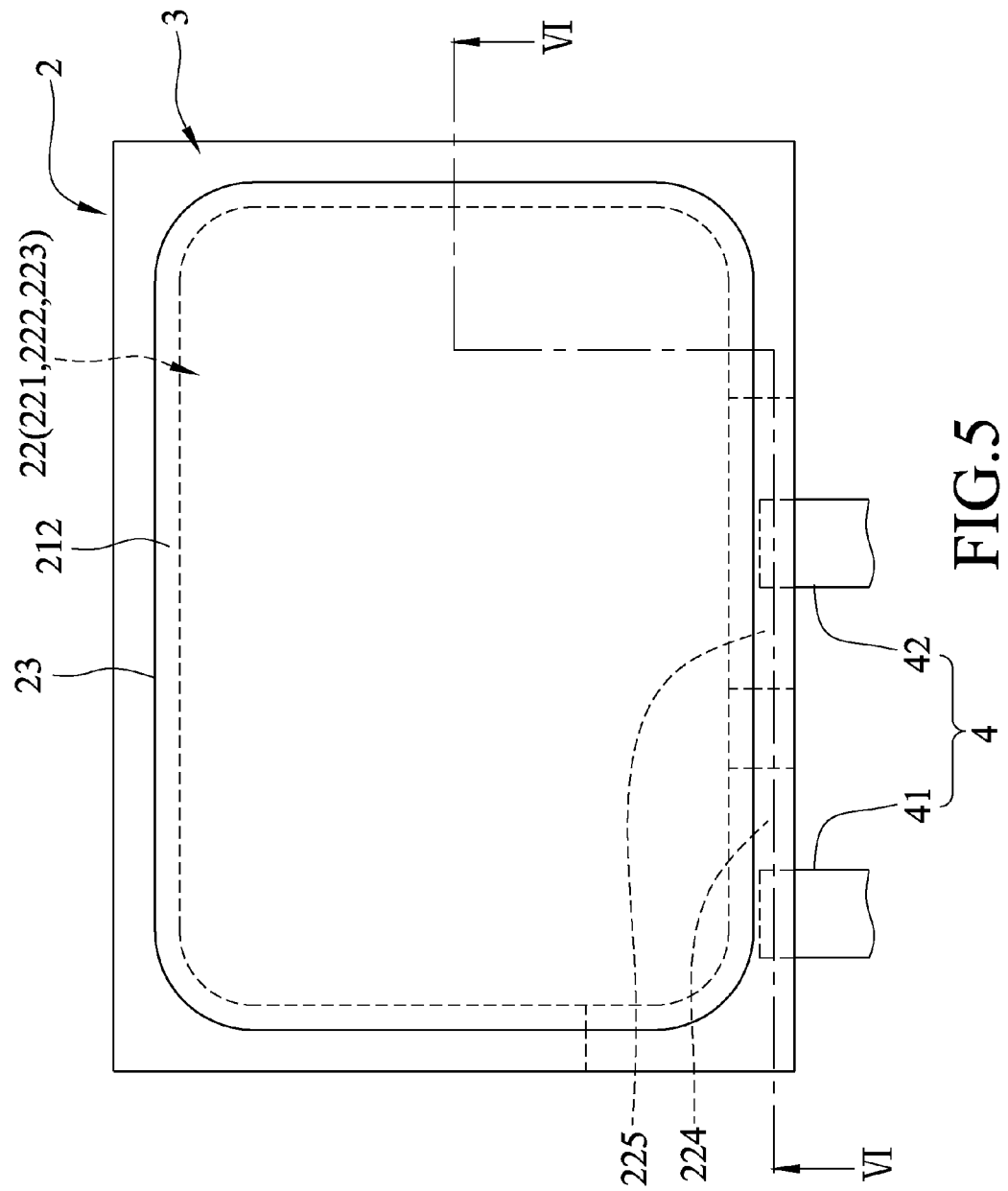
FIG. 5 is a schematic top view of a second preferred embodiment of the OLED illuminating device according to the present invention.
Figure 6:
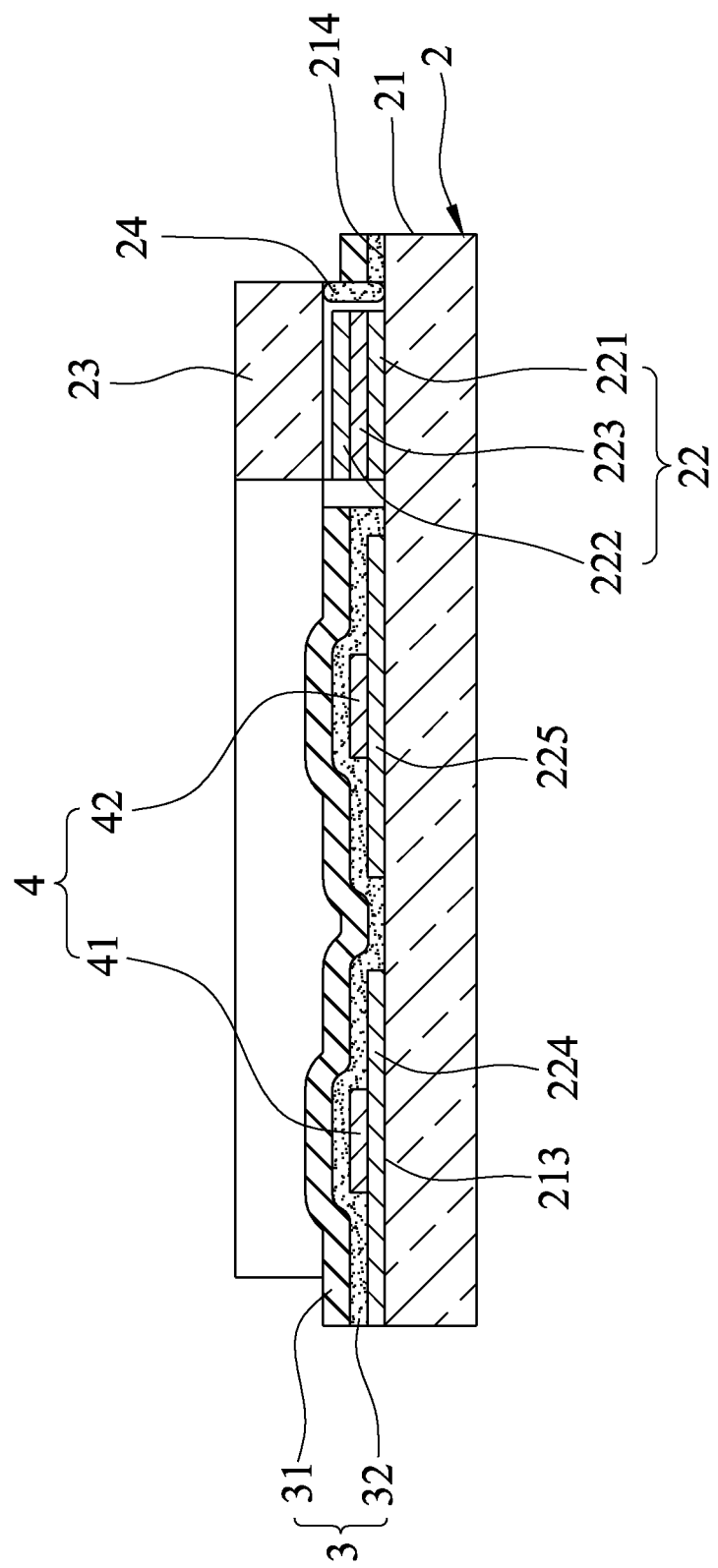
FIG. 6 is a sectional view of the second preferred embodiment taken along line VI-VI of FIG. 5.

Referring to FIGS. 5 and 6, a second preferred embodiment of the OLED illuminating device according to the present invention is shown to be substantially similar to the first preferred embodiment. The difference between the first and second preferred embodiments resides in that the insulating unit 3 is bonded adhesively to the entire first zone 214 of the top surface 211 of the substrate 21. That is, the insulating unit 3 is in a ring shape. The second preferred embodiment has the same advantages as those of the first preferred embodiment.

Figure 7:
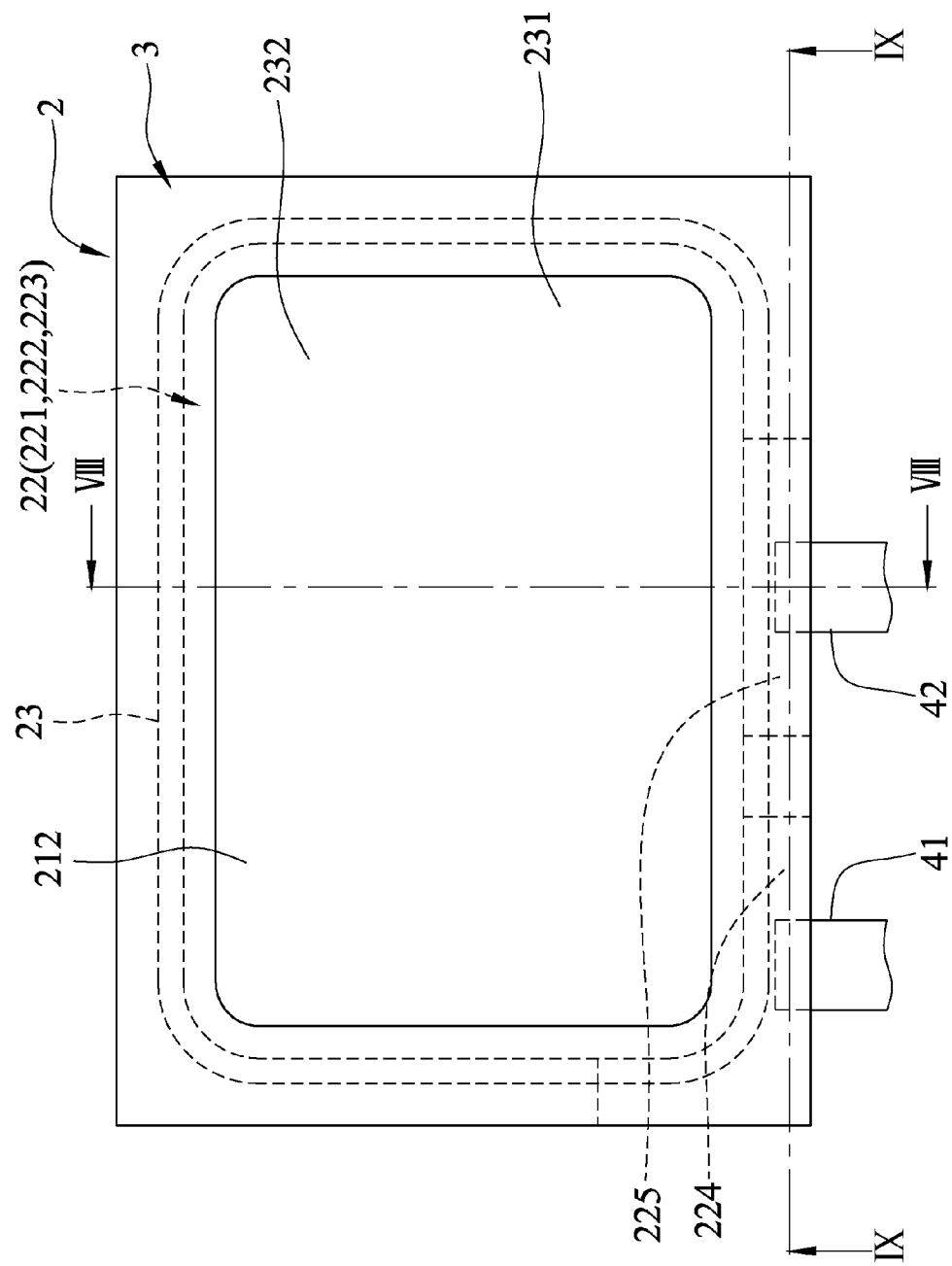
FIG. 7 is a schematic top view of a third preferred embodiment of the OLED illuminating device according to the present invention.
Figure 8:
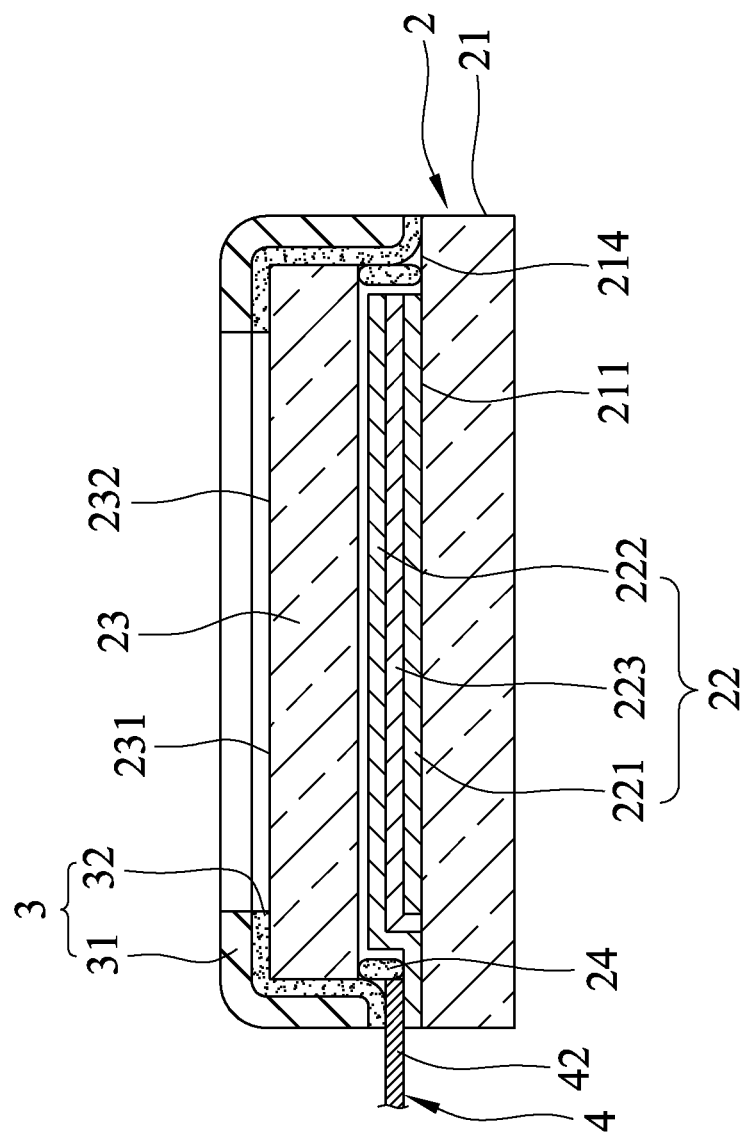
FIG. 8 is a fragmentary sectional view of the third preferred embodiment taken along line VIII-VIII of FIG. 7.
Figure 9:
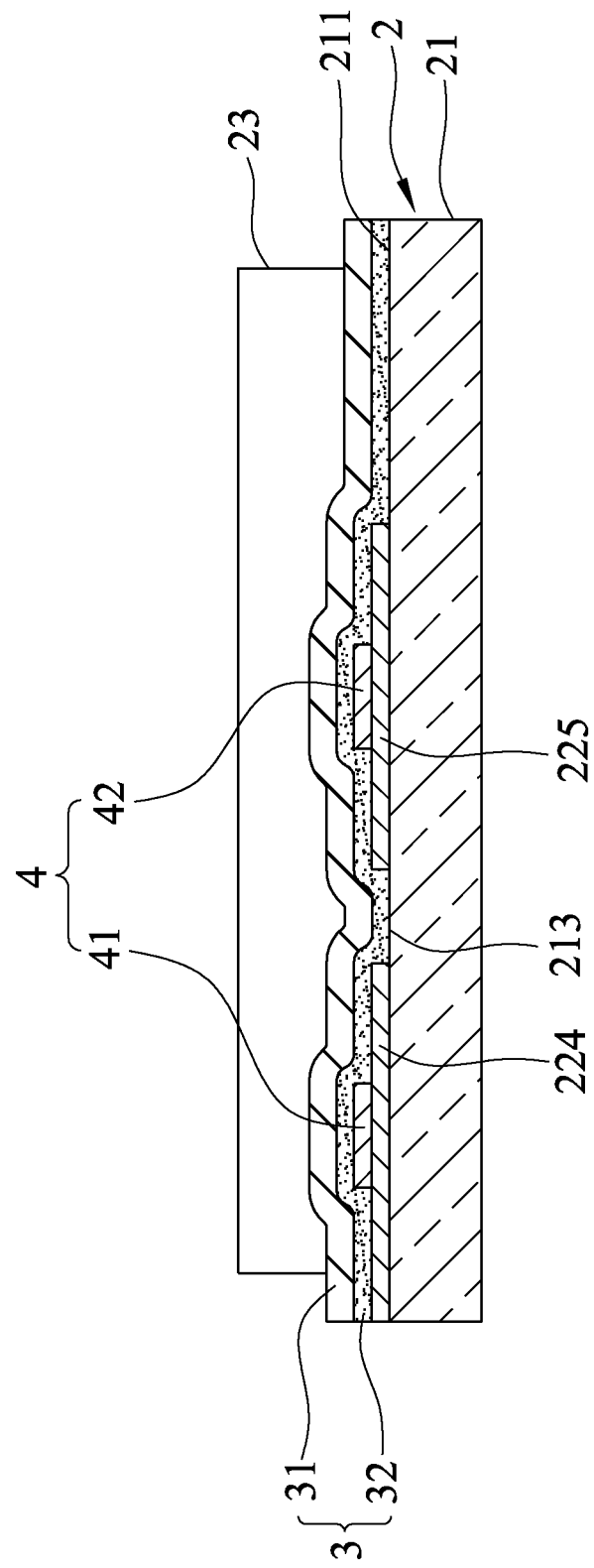
FIG. 9 is a sectional view of the third preferred embodiment taken along line IX-IX of FIG. 7.

Referring to FIGS. 7, 8 and 9, a third preferred embodiment of the OLED illuminating device according to the present invention is shown to be similar to the second preferred embodiment. The difference between the second and third preferred embodiments resides in the configurations of the packaging cover 23 and the insulating unit 3. The packaging cover 23 has a top surface 231 that includes an outer peripheral region and a labeling region 232 surrounded by the outer peripheral region. The insulating unit 3 is configured in a ring shape and further covers the outer peripheral region of the packaging cover 23 so as to expose the labeling region 232. In this embodiment, manufacturing information of the OLED illuminating device, such as date of manufacture, product size, product model, product serial number and so forth, may be labeled on the labeling region 232 for identification.

To sum up, the insulating unit 3 of the OLED illuminating device of the present invention covers the first terminal portion 224 of the first electrode layer 221 and the second terminal portion 225 of the second electrode layer 222 and prevents short circuit of the light emitting element 2 due to electrical connection of the first and second terminal portions 224, 225 caused by an electrically conductive object bridging the same.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. An organic light emitting diode (OLED) illuminating device adapted to be coupled to a power supply, said OLED illuminating device comprising:
   an OLED unit including
      a substrate having a top surface that includes a first zone and a second zone surrounded by said first zone, said first zone having a terminal area,
      a light emitting element disposed on said top surface and having a first electrode layer that includes a first terminal portion which is disposed on said terminal area, a second electrode layer that is disposed on said first electrode layer and that includes a second terminal portion which is disposed on said terminal area, and an organic light emitting multilayer structure that is disposed on said second zone of said top surface and between said first and second electrode layers, said first and second terminal portions being adapted to be coupled to the power supply, and
      a packaging cover covering said light emitting element disposed on said second zone and uncovering said first zone so that said first terminal portion of said first electrode layer and said second terminal portion of said second electrode layer are exposed from said packaging cover; and
   an insulating unit that covers said first and second terminal portions of said first and second electrode layers and that is bonded adhesively at least to said terminal area of said top surface of said substrate.

2. The OLED illuminating device as claimed in claim 1, wherein said insulating unit is bonded adhesively to an entire part of said first zone of said top surface of said substrate.

3. The OLED illuminating device as claimed in claim 2, wherein said packaging cover has a top surface that includes an outer peripheral region and a labeling region surrounded by said outer peripheral region, said insulating unit further covering said outer peripheral region of said packaging cover.

4. The OLED illuminating device as claimed in claim 3, wherein said insulating unit is configured as a ring shape.

5. The OLED illuminating device as claimed in claim 1, wherein said insulating unit includes an insulating layer and an adhesive layer connecting said insulating layer to said substrate.

* * * * *